US011513157B2

(12) United States Patent
Rosu-Hamzescu et al.

(10) Patent No.: US 11,513,157 B2
(45) Date of Patent: Nov. 29, 2022

(54) MEASURING CIRCUIT USING SWITCHED CAPACITORS FOR MEASURING VOLTAGE AND RELATED SYSTEMS, METHODS, AND DEVICES

(71) Applicant: Microchip Technology Incorporated, Chandler, AZ (US)

(72) Inventors: Mihnea Rosu-Hamzescu, Bucharest (RO); Marius Dracea, Bucharest (RO); Sergiu Oprea, Bucharest (RO)

(73) Assignee: Microchip Technology Incorporated, Chandler, AZ (US)

( * ) Notice: Subject to any disclaimer, the term of this patent is extended or adjusted under 35 U.S.C. 154(b) by 148 days.

(21) Appl. No.: 16/861,089

(22) Filed: Apr. 28, 2020

(65) Prior Publication Data
US 2021/0247456 A1    Aug. 12, 2021

Related U.S. Application Data (60) Provisional application No. 62/975,556, filed on Feb. 12, 2020.

(51) Int. Cl.
H02J 7/00        (2006.01)
G01R 31/3835   (2019.01)

(52) U.S. Cl.
CPC ........ G01R 31/3835 (2019.01); H02J 7/0019 (2013.01); H02J 7/0047 (2013.01)

(58) Field of Classification Search
USPC .......................................... 320/103, 116, 119
See application file for complete search history.

(56) References Cited

U.S. PATENT DOCUMENTS

2004/0160229 A1*  8/2004  Fujita ................... B60L 3/0038
                                                            324/607
2005/0194931 A1*  9/2005  Sobue .................. H02J 7/0029
                                                            320/116
(Continued)

FOREIGN PATENT DOCUMENTS

CN    101563600 A  * 10/2009  ......... G01R 19/0084
EP       2063279 A1  *  5/2009  .......... B60L 11/1851
(Continued)

OTHER PUBLICATIONS

International Search Report from International Application No. PCT/US2020/030304, dated Nov. 13, 2020, 4 pages.
(Continued)

Primary Examiner — Brian Ngo
(74) Attorney, Agent, or Firm — TraskBritt (57) ABSTRACT Measuring circuits including switched capacitors, and related systems, methods, and devices are disclosed. A measurement circuit includes a flying capacitor, a grounded capacitor, a first switch, a second switch, a third switch, and a fourth switch. The first switch is configured to selectively electrically connect an electrochemical cell cathode node to a first terminal of the flying capacitor. The second switch is configured to selectively electrically connect an electrochemical cell anode node to a second terminal of the flying capacitor. The third switch is configured to selectively electrically connect the first terminal of the flying capacitor to a third terminal of the grounded capacitor. The fourth switch is configured to electrically connect the second terminal of the flying capacitor to a fourth terminal of the grounded capacitor. The fourth terminal is electrically connected to the reference voltage potential node.

18 Claims, 4 Drawing Sheets

(56) References Cited

U.S. PATENT DOCUMENTS

| | | | |
|---|---|---|---|
| 2007/0078616 A1* | 4/2007 | Kawamura | |
| 2010/0134115 A1* | 6/2010 | Ohnuki | H02J 7/0048 |
| | | | 324/429 |
| 2011/0193526 A1 | 8/2011 | Yang et al. | |
| 2011/0196632 A1* | 8/2011 | Shimizu | G01R 31/3842 |
| | | | 702/63 |
| 2012/0161693 A1* | 6/2012 | Nishizawa | H02J 7/0021 |
| | | | 320/103 |
| 2012/0253716 A1* | 10/2012 | Tsuchiya | |
| 2014/0312914 A1* | 10/2014 | Szczeszynski | |
| 2019/0128943 A1 | 5/2019 | Kawamura | |
| 2020/0271728 A1* | 8/2020 | Chen | G01R 19/16542 |

FOREIGN PATENT DOCUMENTS

| | | | | |
|---|---|---|---|---|
| JP | 2001-201522 A | | 7/2001 | |
| JP | 2009150867 A | * | 7/2009 | B60L 11/1851 |
| WO | WO-2012026064 A1 | * | 3/2012 | G01R 31/3658 |

OTHER PUBLICATIONS

International Written Opinion from International Application No. PCT/US2020/030304, dated Nov. 13, 2020, 7 pages.

\* cited by examiner

MEASURING CIRCUIT USING SWITCHED CAPACITORS FOR MEASURING VOLTAGE AND RELATED SYSTEMS, METHODS, AND DEVICES

CROSS-REFERENCE TO RELATED APPLICATIONS

This application claims priority to U.S. Provisional Patent Application No. 62/975,556, filed Feb. 12, 2020, and titled MEASURING CIRCUIT USING SWITCHED CAPACITORS FOR MEASURING VOLTAGE AND RELATED SYSTEMS, METHODS, AND DEVICES, the entire disclosure of which is hereby incorporated herein by this reference.

FIELD

The present disclosure relates generally to voltage measurement circuits including switched capacitors, and more specifically to voltage measurement circuits for use in balance charging of electrochemical cells.

BACKGROUND

A high degree of accuracy, e.g., 0.5%, of voltage potential measurements of differential voltage potentials with high common mode, such as a measurement of a voltage potential difference across an electrochemical cell in a string of electrochemical cells, may be difficult. To achieve the required accuracy of voltage potential measurements, high voltage differential operational amplifiers or carefully calibrated resistor divider circuits may be used. A relatively high financial cost and a relatively large chip area are among drawbacks accompanying the use of such high voltage differential operational amplifiers. Costly calibration is among the drawbacks accompanying the use of carefully calibrated resistor divider circuits, which may be needed since resistance value tolerances of inexpensive resistor components may be an order of magnitude greater than the 0.5% accuracy requirement.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

Balancing charging of series-connected strings electrochemical cells (e.g., energy cells such as battery cells, without limitation) may extend life and running time of the electrochemical cells. In order to balance charging of series connected strings of electrochemical cells, cell voltage potential differences across each of the electrochemical cells are measured. Measurement of cell voltage potential differences across electrochemical cells in such a series-connected string may, however, be difficult because of high common mode differential voltages inherent in such environments.

Disclosed herein are measurement circuits employing switched capacitors to measure cell voltage potential differences across electrochemical cells in a string of electrochemical cells. Although the disclosure is provided in the context of electrochemical cell measurement, the measurement circuits disclosed herein may be used in any context where accurate measurement of voltage potentials is helpful or desirable, especially where differential voltages with high common mode are being measured.

In some embodiments a measurement circuit including switched capacitors may function as a differential to single ended converter. In conjunction with an analog double multiplexer, each pair of electrochemical cell terminals may be electrically connected to the measurement circuit and measured with a controller via an analog to digital converter input of the controller. According to embodiments disclosed herein, cell balancing, based on cell voltage potential differences measured by measuring circuits disclosed herein, may be implemented with minimal cost and with a small number of components, as will be discussed in more detail herein.

Figure 1:
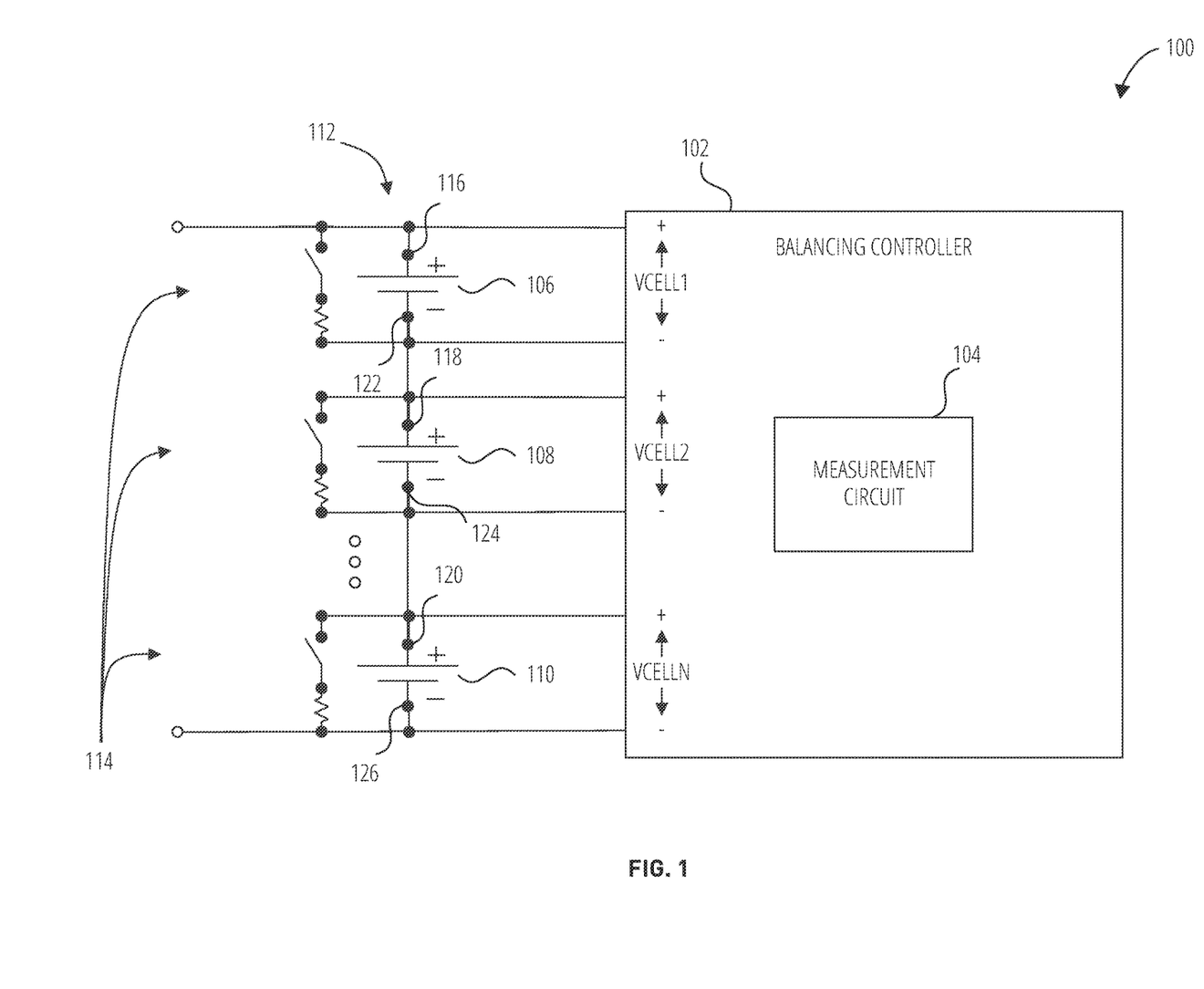
FIG. 1 is a schematic diagram of an electrochemical cell charging system, according to some embodiments.

FIG. 1 is a schematic diagram of an electrochemical cell charging system 100, according to some embodiments. The electrochemical cell charging system 100 includes a balancing controller 102 and a string 112 of electrochemical cells 114. The string 112 of electrochemical cells 114 includes a number N of electrochemical cells 114 including electrochemical cell 106, electrochemical cell 108, . . . , and electrochemical cell 110 electrically connected in series. The electrochemical cells 114 may include rechargeable electrochemical cells, such as lithium ion cells, nickel cadmium cells, nickel metal hydride cells, lead acid cells, nickel zinc cells, or other rechargeable cells. Each of the electrochemical cells 114 includes a cathode and an anode. Specifically, electrochemical cell 106 includes a cathode 116 and an anode 122, electrochemical cell 108 includes a cathode 118 and an anode 124, and electrochemical cell 110 includes a cathode 120 and an anode 126. Cell voltage potential differences across the electrochemical cells 114 include a cell voltage potential difference VCELL1 across electrochemical cell 106, a cell voltage potential difference VCELL2 across electrochemical cell 108, and a cell voltage potential difference VCELLN across electrochemical cell 110.

The balancing controller 102 is configured to balance charging of the electrochemical cells 114. Accordingly, the balancing controller 102 is electrically connected to each of the electrochemical cells 114. The balancing controller 102 includes a measurement circuit 104 configured to measure the cell voltage potential differences VCELL1, VCELL2, . . . , and VCELLN across each of the electrochemical cells 114 without a calibrated resistor divider and without a high voltage differential operational amplifier. The measurement circuit 104 is configured to take the measurements instead using switched capacitors, as will be discussed in more detail with reference to FIG. 2. Accordingly, it may be relatively less expensive, less semiconductor chip area intensive, and/or less calibration intensive to implement the measurement circuit 104 as compared to other measurement circuits that include calibrated resistor dividers or high voltage differential operational amplifiers.

Figure 2:
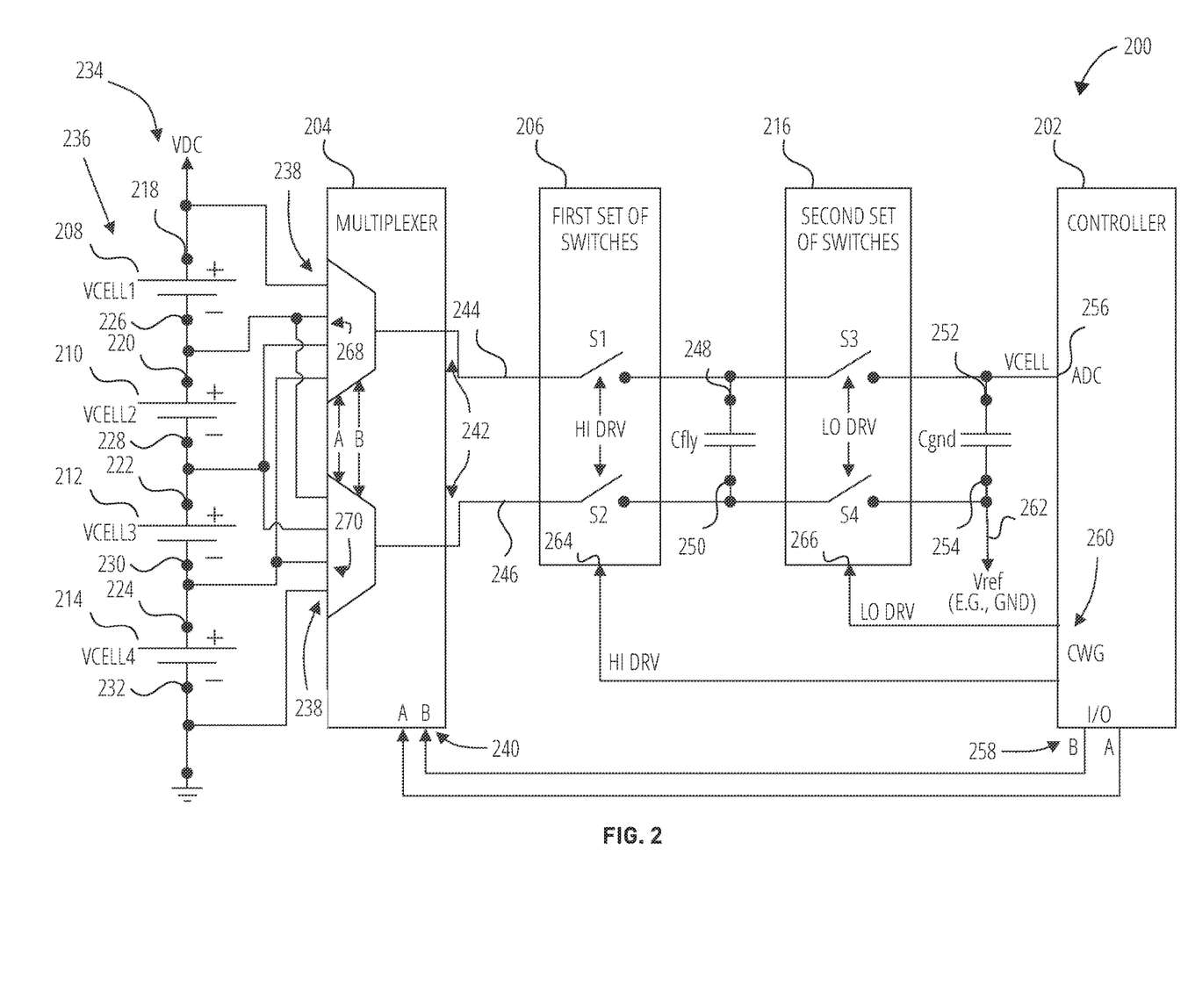
FIG. 2 is a schematic diagram of a measurement circuit, which is an example of a measurement circuit of the electrochemical cell charging system of FIG. 1.

FIG. 2 is a schematic diagram of a measurement circuit 200, which is an example of the measurement circuit 104 of FIG. 1. FIG. 2 illustrates the measurement circuit 200 electrically connected to a string 234 of electrochemical cells 236, which is similar to the string 112 of electrochemical cells 114 discussed above with respect to FIG. 1. A total direct current voltage potential VDC may be provided by the string 234. The string 234 of electrochemical cells 236 of FIG. 2 includes four electrochemical cells 236, including electrochemical cell 208, electrochemical cell 210, electrochemical cell 212, and electrochemical cell 214. Electrochemical cell 208 includes a cathode 218 and an anode 226, electrochemical cell 210 includes a cathode 220 and an anode 228, electrochemical cell 212 includes a cathode 222 and an anode 230, and electrochemical cell 214 includes a cathode 224 and an anode 232. The measurement circuit 200 is configured to measure cell voltage potential differences VCELL1, VCELL2, VCELL3, and VCELL4 across electrochemical cell 208, electrochemical cell 210, electrochemical cell 212, and electrochemical cell 214, respectively. The anode 232 may be further connected to a common potential, such as ground, with voltage potential VDC defined in relation to the common potential.

The measurement circuit 200 includes a multiplexer 204, a first set of switches 206, a flying capacitor Cfly, a second set of switches 216, a grounded capacitor Cgnd, and a controller 202. The multiplexer 204 includes a plurality of electrochemical cell terminal inputs 238, two outputs 242, and multiplexer control inputs 240. The plurality of electrochemical cell terminal inputs 238 include a first plurality of inputs 268 and a second plurality of inputs 270. The first plurality of inputs 268 are electrically connected respectively to the cathodes (cathode 218, cathode 220, cathode 222, and cathode 224) of the electrochemical cells 236. The second plurality of inputs 270 are electrically connected respectively to the anodes (anode 226, anode 228, anode 230, and anode 232) of the electrochemical cells 236. The two outputs 242 are electrically connected respectively to an electrochemical cell cathode node 244 and an electrochemical cell anode node 246. The multiplexer control inputs 240 are electrically connected to multiplexer control outputs 258 of the controller 202.

The controller 202 is configured to provide (e.g., from input/output (I/O) pins of the controller 202, without limitation), multiplexer control signals A, B to the multiplexer control inputs 240. The multiplexer control signals A, B are configured to control the multiplexer 204 to selectively electrically connect the cathode (e.g., cathode 218, cathode 220, cathode 222, or cathode 224) of a selected one of the electrochemical cells 236 to the electrochemical cell cathode node 244 and the anode (e.g., anode 226, anode 228, anode 230, or anode 232) of the selected one of the electrochemical cells 236 to the electrochemical cell anode node 246. In other words, the multiplexer 204 is configured to selectively electrically connect the cathode of a selected electrochemical cell (e.g., electrochemical cell 208, electrochemical cell 210, electrochemical cell 212, or electrochemical cell 214) to the electrochemical cell cathode node 244 and the anode of the selected electrochemical cell to the electrochemical cell anode node 246 responsive to the multiplexer control signals A, B received at the multiplexer control inputs 240. Stated another way, the first plurality of inputs 268 are selectively electrically connectable to the electrochemical cell cathode node 244 and the second plurality of inputs 270 are selectively electrically connectable to the electrochemical cell anode node 246. Accordingly, the controller 202 may control the multiplexer 204 to selectively electrically connect the electrochemical cell cathode node 244 and the electrochemical cell anode node 246 across any one of the electrochemical cells 236 in the string 234.

The flying capacitor Cfly includes a first terminal 248 and a second terminal 250, which are electrically connected to the first set of switches 206. The first set of switches 206 includes a first switch S1 and a second switch S2. In some embodiments the first switch S1 and the second switch S2 may be implemented as transistors (e.g., metal oxide semiconductor (MOS) transistors), relays, other electrically controllable switches, or combinations thereof. The first switch S1 is configured to selectively electrically connect the electrochemical cell cathode node 244 to the first terminal 248 of the flying capacitor Cfly. The second switch S2 is configured to selectively electrically connect the electrochemical cell anode node 246 to the second terminal 250 of the flying capacitor Cfly. The first set of switches 206 also includes a first switch control input 264 electrically connected to a first one of two switch control outputs 260 of the controller 202.

The controller 202 is configured to provide (e.g., from complementary waveform generator (CWG) pins of the controller 202, without limitation), a high drive control signal HI DRV to the first switch control input 264 of the first set of switches 206 to control switching of the first switch S1 and the second switch S2. By way of non-limiting example, the high drive control signal HI DRV may include a square-wave signal oscillating between two logic levels at a selected frequency. As a specific, non-limiting example, the selected frequency of the high drive control signal HI DRV may be substantially 31 kilohertz (kHz). Accordingly, the first switch S1 and the second switch S2 may open and close substantially simultaneously at the selected frequency, repeatedly alternatingly electrically connecting the first terminal 248 and the second terminal 250 of the flying capacitor Cfly to the electrochemical cell cathode node 244 and the electrochemical cell anode node 246, respectively, and isolating the first terminal 248 and the second terminal 250 of the flying capacitor Cfly from the electrochemical cell cathode node 244 and the electrochemical cell anode node 246.

The grounded capacitor Cgnd includes a third terminal 252 and a fourth terminal 254. The third terminal 252 is electrically connected to an analog to digital converter input 256 (e.g., at an analog to digital converter (ADC) pin of the controller 202, without limitation) of the controller 202. The fourth terminal 254 is electrically connected to a reference voltage potential node 262. In operation the reference voltage potential node 262 may be held at a reference voltage potential Vref (e.g., ground, without limitation). There is no requirement that Vref be the same as the common potential to which anode 232 is connected.

The second set of switches 216 includes a third switch S3 and a fourth switch S4. In some embodiments the third switch S3 and the fourth switch S4 may be implemented as transistors (e.g., metal oxide semiconductor (MOS) transistors), relays, other electrically controllable switches, or combinations thereof. The third switch S3 is configured to selectively electrically connect the first terminal 248 of the flying capacitor Cfly to the third terminal 252 of the grounded capacitor Cgnd. The fourth switch S4 is configured to selectively electrically connect the second terminal 250 of the flying capacitor Cfly to the fourth terminal 254 of the grounded capacitor Cgnd. The second set of switches 216 also includes a second switch control input 266 electrically connected to a second one of the switch control outputs 260 of the controller 202.

The controller 202 is configured to provide (e.g., from complementary waveform generator (CWG) pins of the controller 202, without limitation), a low drive control signal LO DRV to the second switch control input 266 of the second set of switches 216 to control switching of the third switch S3 and the fourth switch S4. By way of non-limiting example, the low drive control signal LO DRV may include a square-wave signal oscillating between two logic levels at a selected frequency. As a specific, non-limiting example, the selected frequency of the low drive control signal LO DRV may be substantially 31 kHz. Accordingly, the third switch S3 and the fourth switch S4 may open and close substantially simultaneously at the selected frequency, repeatedly alternatingly electrically connecting the third terminal 252 and the fourth terminal 254 of the grounded capacitor to the first terminal 248 and the second terminal 250 of the flying capacitor Cfly, respectively, and isolating the third terminal 252 and the fourth terminal 254 of the grounded capacitor from the first terminal 248 and the second terminal 250 of the flying capacitor Cfly.

The controller 202 is configured to control the first set of switches 206 and the second set of switches 216 to alternatingly open and close. In other words, the controller 202 is configured to close the first switch S1 and the second switch S2 of the first set of switches 206 at substantially the same time that the controller 202 opens the third switch S3 and the fourth switch S4 of the second set of switches 216. Also, the controller 202 is configured to open the first switch S1 and the second switch S2 of the first set of switches 206 at substantially the same time that the controller 202 closes the third switch S3 and the fourth switch S4 of the second set of switches 216. Stated another way, the controller 202 is configured to control the first set of switches 206 and the second set of switches 216 to alternatingly close the first set of switches 206 and the second set of switches 216 such that the flying capacitor Cfly is alternatingly electrically connected to the electrochemical cell cathode node 244 and the electrochemical cell anode node 246 and to the third terminal 252 and the fourth terminal 254 of the grounded capacitor Cgnd. Accordingly, the controller 202 may control the HI DRV signal and the LO DRV to be substantially complementary signals. By way of non-limiting example, the HI DRV and the LO DRV signals may be complementary signals with a dead time. As a result, a period of time (i.e., the dead time) between the opening of the first set of switches 206 or the second set of switches 216 may be allowed before closing of the other of the first set of switches 206 or the second set of switches 216. The length of the dead time may depend on the time required for the first set of switches 206 and the second set of switches 216 to turn on and off, and should be set to ensure that conductivity of the first set of switches 206 does not overlap in time with conductivity of the second set of switches 216. Since the first switch S1 and the third switch S3 are controlled by complementary signals with dead time, the analog to digital converter input 256 of the controller 202 may not electrically connect directly to the electrochemical cell cathode node 244. Similarly, since the second switch S2 and the fourth switch S4 are controlled by complementary signals with dead time, the reference voltage potential node 262 may not electrically connect directly to the electrochemical cell anode node 246.

In operation the controller 202 may control the multiplexer 204 to electrically connect each of the electrochemical cells 236, one at a time, to the electrochemical cell cathode node 244 and the electrochemical cell anode node 246, and control switching of the first set of switches 206 and the second set of switches 216 to charge the third terminal 252 of the grounded capacitor Cgnd to a cell voltage potential VCELL corresponding to a cell voltage potential difference across the selected one of the electrochemical cells 236. For example, the controller 202 may control the multiplexer 204 to electrically connect the cathode 218 and the anode 226 of electrochemical cell 208 to the electrochemical cell cathode node 244 and the electrochemical cell anode node 246, respectively, and control switching of the first set of switches 206 to charge the flying capacitor Cfly to a cell voltage potential VCELL that corresponds to the cell voltage potential difference VCELL1 across electrochemical cell 208. The controller 202 may then control the second set of switches 216 to charge the third terminal 252 to the cell voltage potential VCELL that corresponds to the cell voltage potential difference VCELL1 across electrochemical cell 208, by transferring charge from the flying capacitor Cfly to the grounded capacitor Cgnd through second set of switches 216. The controller 202 receives the cell voltage potential VCELL at its analog to digital converter input 256, and samples the cell voltage potential VCELL using an internal A/D converter.

In some embodiments the controller 202 may be configured to balance charging of the electrochemical cells 236 based on the sampled cell voltage potential VCELL measured for each of the electrochemical cells 236. As a result, an electrochemical cell charging system (e.g., the electrochemical cell charging system 100) may be implemented using a single controller (e.g., the controller 202, without limitation) to control measurement of cell voltage potential differences (VCELL1–VCELL4) across the electrochemical cells 236, balance charging of the electrochemical cells 236, and control charging of the electrochemical cells 236. As a result, circuit board layout may be simplified and the cost for controllers may be reduced as compared to systems that utilize multiple controllers rather than a single controller.

It should be noted that although FIG. 2 illustrates the controller 202 controlling the first set of switches 206 and the second set of switches 216, the first set of switches 206 and second set of switches 216 may instead be controlled by an oscillator circuit (not shown) without departing from the scope of the disclosure. Also, a single oscillating signal (not shown) (originating at the controller 202 or some other source such as a separate controller) may be used to control the first set of switches 206 and the second set of switches 216 using an inverter (not shown) between the first switch control input 264 of the first set of switches 206 and the second switch control input 266 of the second set of switches 216 without departing from the scope of the disclosure. Moreover, the multiplexer 204 may be controlled by some other circuit (not shown), such as another controller, separate from the controller 202, which receives and samples the cell voltage potential VCELL without departing from the scope of the disclosure.

The measurement circuit 200 of FIG. 2 is illustrated in relation to a four electrochemical cell string 234 of electrochemical cells 236. It should be noted that the measurement circuit 200 may be adapted for use with strings of any number of electrochemical cells. For example, where a number M of electrochemical cells is included in the string 234 of electrochemical cells 236, the multiplexer 204 may be implemented to include a double M:1 multiplexer to multiplex the cathodes and anodes of the electrochemical cells 236 down to the two outputs 242 of the electrochemical cells 236. Accordingly, the measurement circuit 200 may be scaled to work with any number M of electrochemical cells 236 in the string 234.

Capacitance values of the flying capacitor Cfly and the grounded capacitor Cgnd may be selected to enable the grounded capacitor Cgnd to charge to the appropriate cell voltage potential VCELL after only a few oscillation periods (e.g., three to five periods, without limitation) of HI DRV and LO DRV. Accordingly, selection of capacitance values for the flying capacitor Cfly and the grounded capacitor Cgnd may be based on electrical resistances and leakage currents of the first set of switches 206 and the second set of switches 216 and an expected magnitude of the cell voltage potential VCELL. By way of non-limiting example, assuming relatively low electrical resistances (e.g., less than one kiloohm) of the first set of switches 206 and the second set of switches 216, capacitance values of the flying capacitor Cfly and the grounded capacitor Cgnd may be selected to be substantially one microfarad. It should be noted that parasitic system capacitances and resistances of the measurement circuit 200 may also affect the charge time of the grounded capacitor Cgnd.

Figure 3:
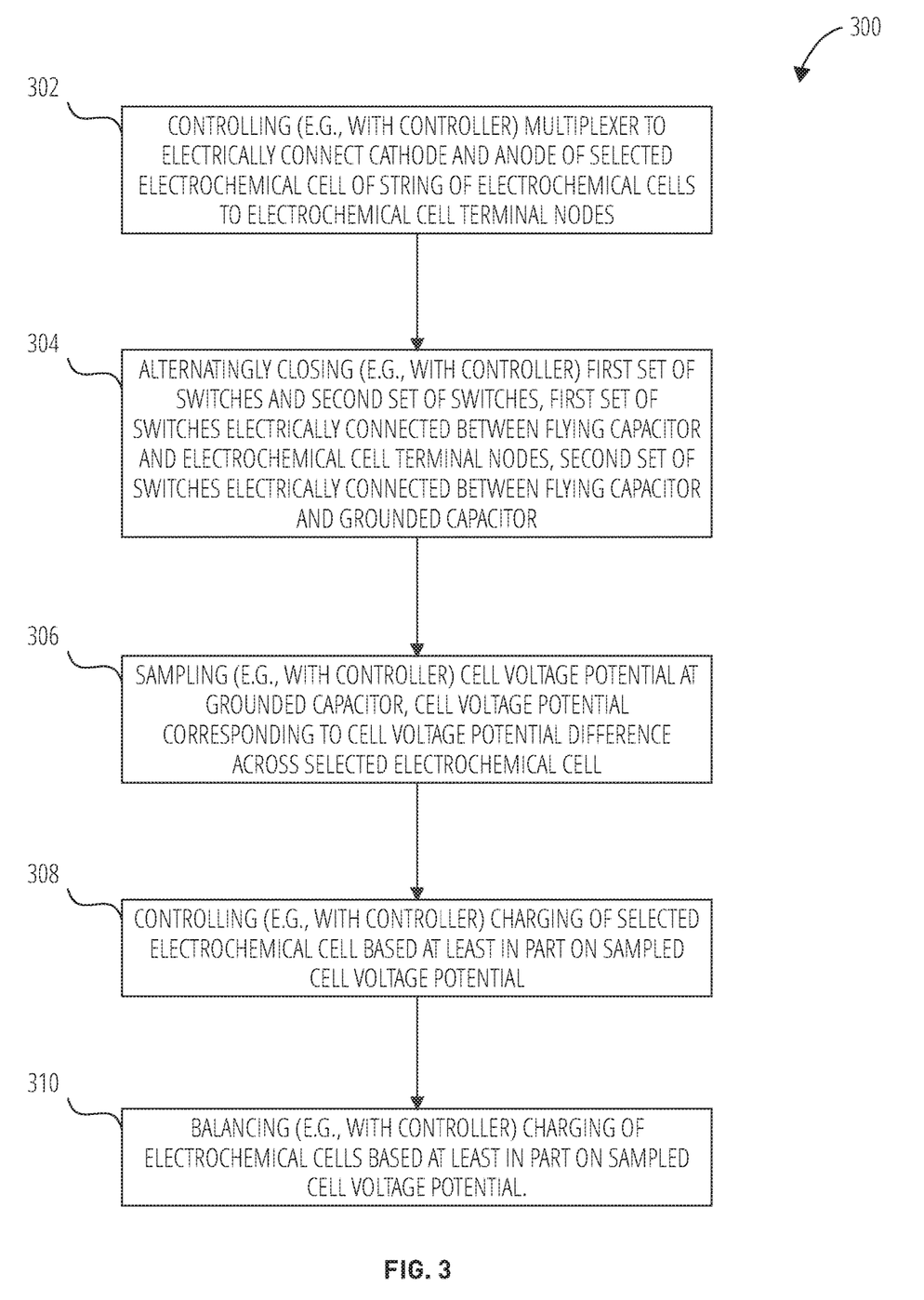
FIG. 3 is a flowchart illustrating a method of measuring cell voltage potential differences across electrochemical cells in a string of electrochemical cells, according to some embodiments.

FIG. 3 is a flowchart illustrating a method 300 of measuring cell voltage potential differences across electrochemical cells in a string of electrochemical cells, according to some embodiments. At operation 302, method 300 includes controlling (e.g., with a controller, without limitation) a multiplexer to electrically connect a cathode and an anode of a selected electrochemical cell of the string of electrochemical cells to electrochemical cell terminal nodes (e.g., the electrochemical cell cathode node 244 and the electrochemical cell anode node 246 of FIG. 2, without limitation). At operation 304, method 300 includes alternatingly closing (e.g., with the controller, without limitation) a first set of switches and a second set of switches, the first set of switches electrically connected between a flying capacitor and the electrochemical cell terminal nodes, the second set of switches electrically connected between the flying capacitor and a grounded capacitor. Preferably, the alternatingly closing should be performed with dead time to prevent direct electrical connection between the grounded capacitor Cgnd and the selected electrochemical cell of the string of electrochemical cells.

At operation 306, method 300 includes sampling (e.g., with the controller, without limitation) a cell voltage potential at the grounded capacitor, the cell voltage potential corresponding to a cell voltage potential difference across the selected electrochemical cell. At operation 308, method 300 includes controlling (e.g., with the controller, without limitation) charging of the selected electrochemical cell based at least in part on the sampled cell voltage potential. At operation 310, method 300 includes balancing (e.g., with the controller, without limitation) charging of the electrochemical cells based at least in part on the sampled cell voltage potential.

Figure 4:
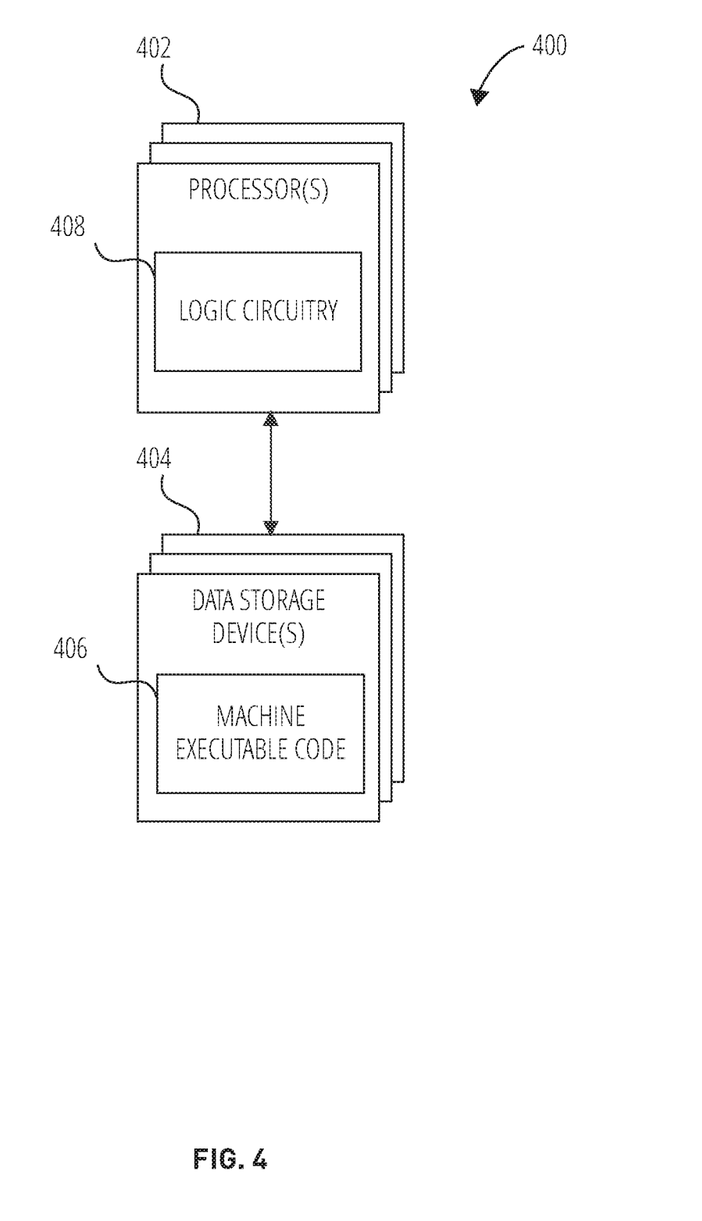
FIG. 4 is a block diagram of circuitry that, in some embodiments, may be used to implement various functions, operations, acts, processes, and/or methods disclosed herein.

It will be appreciated by those of ordinary skill in the art that functional elements of embodiments disclosed herein (e.g., functions, operations, acts, processes, and/or methods) may be implemented in any suitable hardware, software, firmware, or combinations thereof. FIG. 4 illustrates non-limiting examples of implementations of functional elements disclosed herein. In some embodiments, some or all portions of the functional elements disclosed herein may be performed by hardware specially configured for carrying out the functional elements.

FIG. 4 is a block diagram of circuitry 400 that, in some embodiments, may be used to implement various functions, operations, acts, processes, and/or methods disclosed herein. The circuitry 400 includes one or more processors 402 (sometimes referred to herein as "processors 402") operably coupled to one or more data storage devices (sometimes referred to herein as "storage 404"). The storage 404 includes machine executable code 406 stored thereon and the processors 402 include logic circuitry 408. The machine executable code 406 includes information describing functional elements that may be implemented by (e.g., performed by) the logic circuitry 408. The logic circuitry 408 is adapted to implement (e.g., perform) the functional elements described by the machine executable code 406. The circuitry 400, when executing the functional elements described by the machine executable code 406, should be considered as special purpose hardware configured for carrying out functional elements disclosed herein. In some embodiments the processors 402 may be configured to perform the functional elements described by the machine executable code 406 sequentially, concurrently (e.g., on one or more different hardware platforms), or in one or more parallel process streams.

When implemented by logic circuitry 408 of the processors 402, the machine executable code 406 is configured to adapt the processors 402 to perform operations of embodiments disclosed herein. For example, the machine executable code 406 may be configured to adapt the processors 402 to perform at least a portion or a totality of the method 300 of FIG. 3. As another example, the machine executable code 406 may be configured to adapt the processors 402 to perform at least a portion or a totality of the operations discussed for the balancing controller 102 of FIG. 1 and/or the controller 202 of FIG. 2.

The processors 402 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is configured to execute functional elements corresponding to the machine executable code 406 (e.g., software code, firmware code, hardware descriptions) related to embodiments of the present disclosure. It is noted that a general-purpose processor (may also be referred to herein as a host processor or simply a host) may be a microprocessor, but in the alternative, the processors 402 may include any conventional processor, controller, microcontroller, or state machine. The processors 402 may also be implemented as a combination of computing devices, such as a combination of a DSP and a microprocessor, a plurality of microprocessors, one or more microprocessors in conjunction with a DSP core, or any other such configuration.

In some embodiments the storage 404 includes volatile data storage (e.g., random-access memory (RAM)), non-volatile data storage (e.g., Flash memory, a hard disc drive, a solid state drive, erasable programmable read-only memory (EPROM), etc.). In some embodiments the processors 402 and the storage 404 may be implemented into a single device (e.g., a semiconductor device product, a system on chip (SOC), etc.). In some embodiments the processors 402 and the storage 404 may be implemented into separate devices.

In some embodiments the machine executable code 406 may include computer-readable instructions (e.g., software code, firmware code). By way of non-limiting example, the computer-readable instructions may be stored by the storage 404, accessed directly by the processors 402, and executed by the processors 402 using at least the logic circuitry 408. Also by way of non-limiting example, the computer-readable instructions may be stored on the storage 404, transferred to a memory device (not shown) for execution, and executed by the processors 402 using at least the logic circuitry 408. Accordingly, in some embodiments the logic circuitry 408 includes electrically configurable logic circuitry 408.

In some embodiments the machine executable code 406 may describe hardware (e.g., circuitry) to be implemented in the logic circuitry 408 to perform the functional elements. This hardware may be described at any of a variety of levels of abstraction, from low-level transistor layouts to high-level description languages. At a high-level of abstraction, a hardware description language (HDL) such as an IEEE Standard hardware description language (HDL) may be used. By way of non-limiting examples, Verilog™, SystemVerilog™ or very large scale integration (VLSI) hardware description language (VHDL™) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuitry 408 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some embodiments the machine executable code 406 may include an HDL, an RTL, a GL description, a mask level description, other hardware description, or any combination thereof.

In embodiments where the machine executable code 406 includes a hardware description (at any level of abstraction), a system (not shown, but including the storage 404) may be configured to implement the hardware description described by the machine executable code 406. By way of non-limiting example, the processors 402 may include a programmable logic device (e.g., an FPGA or a PLC) and the logic circuitry 408 may be electrically controlled to implement circuitry corresponding to the hardware description into the logic circuitry 408. Also by way of non-limiting example, the logic circuitry 408 may include hard-wired logic manufactured by a manufacturing system (not shown, but including the storage 404) according to the hardware description of the machine executable code 406.

Regardless of whether the machine executable code 406 includes computer-readable instructions or a hardware description, the logic circuitry 408 is adapted to perform the functional elements described by the machine executable code 406 when implementing the functional elements of the machine executable code 406. It is noted that although a hardware description may not directly describe functional elements, a hardware description indirectly describes functional elements that the hardware elements described by the hardware description are capable of performing.

EXAMPLES

A non-exhaustive, non-limiting list of example embodiments follows. Not each of the example embodiments listed below are explicitly and individually indicated as being combinable with all others of the example embodiments listed below and embodiments discussed above. It is intended, however, that these example embodiments are combinable with all other example embodiments and embodiments discussed above unless it would be apparent to one of ordinary skill in the art that the embodiments are not combinable.

Example 1: A measurement circuit, comprising: a flying capacitor comprising a first terminal and a second terminal; an electrochemical cell cathode node; an electrochemical cell anode node; a first set of switches including a first switch and a second switch, the first switch between the electrochemical cell cathode node and the first terminal of the flying capacitor, the second switch between the electrochemical cell anode node and the second terminal of the flying capacitor; a reference voltage potential node; a grounded capacitor including a third terminal and a fourth terminal, the fourth terminal electrically connected to the reference voltage potential node; and a second set of switches including a third switch and a fourth switch, the third switch between the first terminal of the flying capacitor and the third terminal of the grounded capacitor, the fourth switch between the second terminal of the flying capacitor and the fourth terminal of the grounded capacitor.

Example 2: The measurement circuit of Example 1, further comprising a controller including an analog to digital converter input electrically connected to the third terminal of the grounded capacitor.

Example 3: The measurement circuit of Example 2, wherein the controller is configured to control the first set of switches and the second set of switches to alternatingly close the first set of switches and the second set of switches such that the flying capacitor is alternatingly electrically connected to the electrochemical cell cathode node and the electrochemical cell anode node and to the third terminal and the fourth terminal of the grounded capacitor.

Example 4: The measurement circuit according to any one of Examples 1-3, further comprising a multiplexer including a first plurality of inputs and a second plurality of inputs, the first plurality of inputs selectively electrically connectable to the electrochemical cell cathode node, the second plurality of inputs selectively electrically connectable to the electrochemical cell anode node.

Example 5: The measurement circuit of Example 4, wherein the first plurality of inputs are electrically connected to cathodes of respective electrochemical cells of a string of series-connected electrochemical cells and the second plurality of inputs of the multiplexer are electrically connected to anodes of respective electrochemical cells of the string of series-connected electrochemical cells.

Example 6: The measurement circuit of Example 5, further comprising a controller electrically connected to the multiplexer, the controller configured to control the multiplexer to selectively electrically connect a cathode and an anode of each of the electrochemical cells, one at a time, to the electrochemical cell cathode node and the electrochemical cell anode node, respectively.

Example 7: The measurement circuit of Example 6, wherein the controller is further configured to control switching of the first set of switches and the second set of switches.

Example 8: The measurement circuit according to any one of Examples 1-7, wherein the reference voltage potential node is electrically connected to a ground terminal of the measurement circuit.

Example 9: An electrochemical cell charging system, comprising: a string of series-connected electrochemical cells comprising a plurality of electrochemical cells, each of the plurality of electrochemical cells including a cathode and an anode; a multiplexer including a plurality of electrochemical cell terminal inputs, two outputs, and multiplexer control inputs, the plurality of electrochemical cell terminal inputs of the multiplexer respectively electrically connected to the cathode and the anode of each of the plurality of electrochemical cells, the two outputs respectively electrically connected to an electrochemical cell cathode node and an electrochemical cell anode node, the multiplexer configured to selectively electrically connect the cathode of a selected electrochemical cell to the electrochemical cell cathode node and the anode of the selected electrochemical cell to the electrochemical cell anode node responsive to multiplexer control signals received at the multiplexer control inputs; a flying capacitor including a first terminal and a second terminal; a first set of switches including a first switch and a second switch, the first switch configured to selectively electrically connect the electrochemical cell cathode node to the first terminal of the flying capacitor, the second switch configured to selectively electrically connect the electrochemical cell anode node to the second terminal of the flying capacitor; a grounded capacitor including a third terminal and a fourth terminal, the fourth terminal electrically connected to a reference voltage potential node; a second set of switches including a third switch and a fourth switch, the third switch configured to selectively electrically connect the first terminal of the flying capacitor to the third terminal of the grounded capacitor, the fourth switch configured to selectively electrically connect the second terminal of the flying capacitor to the fourth terminal of the grounded capacitor; and a controller including an analog to digital converter input electrically connected to the third terminal of the grounded capacitor.

Example 10: The electrochemical cell charging system of Example 9, wherein the controller is configured to generate the multiplexer control signals.

Example 11: The electrochemical cell charging system according to any one of Examples 9 and 10, wherein the controller is configured to control the first set of switches and the second set of switches to alternatingly close the first set of switches and the second set of switches so as to provide a cell voltage potential difference across the selected electrochemical cell to the analog to digital converter input.

Example 12: The electrochemical cell charging system according to any one of Examples 9-11, wherein the controller is configured to balance charging of the plurality of electrochemical cells.

Example 13: The electrochemical cell charging system according to any one of Examples 9-12, wherein the reference voltage potential node is electrically connected to a ground node of the electrochemical cell charging system.

Example 14: The electrochemical cell charging system according to any one of Examples 9-13, wherein the controller is configured to sample, at the analog to digital converter input, a cell voltage potential corresponding to a cell voltage potential difference of the selected electrochemical cell.

Example 15: The electrochemical cell charging system according to any one of Examples 9-14, wherein the controller is configured to generate switch control signals configured to control switching of the first set of switches and the second set of switches.

Example 16: The electrochemical cell charging system of Example 15, wherein the controller is configured to provide the switch control signals from complementary waveform generator pins of the controller.

Example 17: The electrochemical cell charging system according to any one of Examples 9-16, wherein the plurality of electrochemical cells includes lithium ion cells.

Example 18: A method comprising: controlling, with a controller, a multiplexer to electrically connect a cathode and an anode of a selected electrochemical cell of a string of electrochemical cells to respective electrochemical cell terminal nodes; alternatingly closing, with the controller, a first set of switches and a second set of switches, the first set of switches electrically connected between a flying capacitor and the electrochemical cell terminal nodes, the second set of switches electrically connected between the flying capacitor and a grounded capacitor; sampling, with the controller, a cell voltage potential at the grounded capacitor, the cell voltage potential corresponding to a cell voltage potential difference across the selected electrochemical cell.

Example 19: The method of Example 18, further comprising controlling, with the controller, charging of the selected electrochemical cell based at least in part on the sampled cell voltage potential.

Example 20: The method according to any one of Examples 18 and 19, further comprising balancing, with the controller, charging of the electrochemical cells based at least in part on the sampled cell voltage potential.

Example 21: A measurement circuit, comprising: energy cell terminal inputs configured to electrically connect to respective cells of series-connected cells of an energy cell; an analog to digital converter; and a differential to single ended converter electrically connected between the energy cell inputs and the analog to digital converter, the differential to single ended converter including a switched capacitor circuit.

CONCLUSION

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to,"

the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. A measurement circuit, comprising:
    a flying capacitor comprising a first terminal and a second terminal;
    an electrochemical cell cathode node;
    an electrochemical cell anode node;
    a first set of switches including a first switch and a second switch, the first switch between the electrochemical cell cathode node and the first terminal of the flying capacitor, the second switch between the electrochemical cell anode node and the second terminal of the flying capacitor;
    a reference voltage potential node;
    a grounded capacitor including a third terminal and a fourth terminal, the fourth terminal electrically connected to the reference voltage potential node;
    a second set of switches including a third switch and a fourth switch, the third switch between the first terminal of the flying capacitor and the third terminal of the grounded capacitor, the fourth switch between the second terminal of the flying capacitor and the fourth terminal of the grounded capacitor; and
    a controller to provide a first signal and a second signal to the first set of switches and the second set of switches, respectively, to control opening and closing of the first set of switches and the second set of switches;
    wherein, the first signal and second signal are complementary signals having a dead time between opening of the first set of switches and closing of the second set of switches and between opening of the second set of switches and closing of the first set of switches.

2. The measurement circuit of claim 1, wherein the controller includes an analog to digital converter input electrically connected to the third terminal of the grounded capacitor.

3. The measurement circuit of claim 2, wherein the controller is to control the first set of switches and the second set of switches to alternatingly close the first set of switches and the second set of switches such that the flying capacitor is alternatingly electrically connected to the electrochemical cell cathode node and the electrochemical cell anode node and to the third terminal and the fourth terminal of the grounded capacitor.

4. The measurement circuit of claim 1, comprising a multiplexer including a first plurality of inputs and a second plurality of inputs, the first plurality of inputs selectively electrically connectable to the electrochemical cell cathode node, the second plurality of inputs selectively electrically connectable to the electrochemical cell anode node.

5. The measurement circuit of claim 4, wherein the first plurality of inputs are electrically connected to cathodes of respective electrochemical cells of a string of series-connected electrochemical cells and the second plurality of inputs of the multiplexer are electrically connected to anodes of respective electrochemical cells of the string of series-connected electrochemical cells.

6. The measurement circuit of claim 5, comprising a controller electrically connected to the multiplexer, the controller to control the multiplexer to selectively electrically connect a cathode and an anode of each of the electrochemical cells, one at a time, to the electrochemical cell cathode node and the electrochemical cell anode node, respectively.

7. The measurement circuit of claim 6, wherein the controller is to control switching of the first set of switches and the second set of switches.

8. The measurement circuit of claim 1, wherein the reference voltage potential node is electrically connected to a ground terminal of the measurement circuit.

9. An electrochemical cell charging system, comprising:
    a string of series-connected electrochemical cells comprising a plurality of electrochemical cells, each of the plurality of electrochemical cells including a cathode and an anode;
    a multiplexer including a plurality of electrochemical cell terminal inputs, two outputs, and multiplexer control inputs, the plurality of electrochemical cell terminal inputs of the multiplexer respectively electrically connected to the cathode and the anode of each of the plurality of electrochemical cells, the two outputs respectively electrically connected to an electrochemical cell cathode node and an electrochemical cell anode node, the multiplexer to selectively electrically connect the cathode of a selected electrochemical cell to the electrochemical cell cathode node and the anode of the selected electrochemical cell to the electrochemical cell anode node responsive to multiplexer control signals received at the multiplexer control inputs;

a flying capacitor including a first terminal and a second terminal;

a first set of switches including a first switch and a second switch, the first switch to selectively electrically connect the electrochemical cell cathode node to the first terminal of the flying capacitor, the second switch to selectively electrically connect the electrochemical cell anode node to the second terminal of the flying capacitor;

a grounded capacitor including a third terminal and a fourth terminal, the fourth terminal electrically connected to a reference voltage potential node;

a second set of switches including a third switch and a fourth switch, the third switch to selectively electrically connect the first terminal of the flying capacitor to the third terminal of the grounded capacitor, the fourth switch to selectively electrically connect the second terminal of the flying capacitor to the fourth terminal of the grounded capacitor; and a controller including an analog to digital converter, the analog to digital converter including an input electrically connected to the third terminal of the grounded capacitor.

10. The electrochemical cell charging system of claim 9, wherein the controller is to generate the multiplexer control signals.

11. The electrochemical cell charging system of claim 9, wherein the controller is to control the first set of switches and the second set of switches to alternatingly close the first set of switches and the second set of switches so as to provide a cell voltage potential difference across the selected electrochemical cell to the analog to digital converter input.

12. The electrochemical cell charging system of claim 9, wherein the controller is to balance charging of the plurality of electrochemical cells.

13. The electrochemical cell charging system of claim 9, wherein the reference voltage potential node is electrically connected to a ground node of the electrochemical cell charging system.

14. The electrochemical cell charging system of claim 9, wherein the controller is to sample, at the analog to digital converter input, a cell voltage potential corresponding to a cell voltage potential difference of the selected electrochemical cell.

15. The electrochemical cell charging system of claim 9, wherein the controller is to generate switch control signals to control switching of the first set of switches and the second set of switches.

16. The electrochemical cell charging system of claim 15, wherein the controller is to provide the switch control signals from complementary waveform generator pins of the controller.

17. A method comprising:
controlling, with a controller, a multiplexer to electrically connect a cathode and an anode of a selected electrochemical cell of a string of electrochemical cells to respective electrochemical cell terminal nodes;
alternatingly closing, with the controller, a first set of switches and a second set of switches, the first set of switches electrically connected between a flying capacitor and the electrochemical cell terminal nodes, the second set of switches electrically connected between the flying capacitor and a grounded capacitor;
sampling, with the controller, a cell voltage potential at the grounded capacitor, the cell voltage potential corresponding to a cell voltage potential difference across the selected electrochemical cell; and
balancing, with the controller, charging of the electrochemical cells based at least in part on the sampled cell voltage potential.

18. The method of claim 17, comprising controlling, with the controller, charging of the selected electrochemical cell based at least in part on the sampled cell voltage potential.

* * * * *